(12) United States Patent
Ong

(10) Patent No.: US 11,803,457 B2
(45) Date of Patent: Oct. 31, 2023

(54) METHODS AND SYSTEMS FOR DEVICE MAINTENANCE AND CONTROL

(71) Applicant: COMCAST CABLE COMMUNICATIONS, LLC, Philadelphia, PA (US)

(72) Inventor: Ivan Ong, Malvern, PA (US)

(73) Assignee: COMCAST CABLE COMMUNICATIONS, LLC, Philadelphia, PA (US)

( * ) Notice: Subject to any disclaimer, the term of this patent is extended or adjusted under 35 U.S.C. 154(b) by 733 days.

(21) Appl. No.: 16/775,021

(22) Filed: Jan. 28, 2020

(65) Prior Publication Data

US 2021/0232475 A1 Jul. 29, 2021

(51) Int. Cl.
*G06F 11/30* (2006.01)
*G06F 1/20* (2006.01)
*H05K 7/20* (2006.01)

(52) U.S. Cl.
CPC .......... *G06F 11/3058* (2013.01); *G06F 1/206* (2013.01); *H05K 7/20163* (2013.01); *H05K 7/20172* (2013.01); *H05K 7/20209* (2013.01)

(58) Field of Classification Search
CPC ...... G06F 11/3058; G06F 11/30; G06F 11/00; G06F 1/206; G06F 1/20; G06F 1/16; G06F 1/00; G06F 11/3409; G06F 11/3466; H05K 7/20172; H05K 7/20163; H05K 7/20154; H05K 7/20136; H05K 7/20209; H05K 7/20009; H05K 7/20; H05K 7/00
See application file for complete search history.

(56) References Cited

U.S. PATENT DOCUMENTS

| | | | |
|---|---|---|---|
| 7,432,675 B1 | 10/2008 | Corbett et al. | |
| 7,806,344 B2 | 10/2010 | Chang | |
| 9,903,381 B2 | 2/2018 | Liu et al. | |
| 10,060,438 B2 | 8/2018 | Duan et al. | |
| 2007/0095522 A1* | 5/2007 | Chang | G06F 1/206 165/287 |
| 2009/0009960 A1* | 1/2009 | Melanson | H05K 7/20209 361/679.48 |
| 2010/0030395 A1* | 2/2010 | Shimotono | G06F 1/206 715/764 |
| 2013/0294029 A1* | 11/2013 | Guo | F04D 25/166 361/695 |
| 2016/0238014 A1* | 8/2016 | Liu | F04D 19/005 |

* cited by examiner

*Primary Examiner* — Mohamed Charioui
(74) *Attorney, Agent, or Firm* — Ballard Spahr LLP

(57) ABSTRACT

Methods and systems for hardware maintenance and control are described. An electronic device may have a cooling component designed to dissipate excess thermal energy within the electronic device, or another component to address an operational deficiency. The electronic device may determine a performance threshold, a usage parameter, and a time and a duration for performing a maintenance procedure.

28 Claims, 9 Drawing Sheets

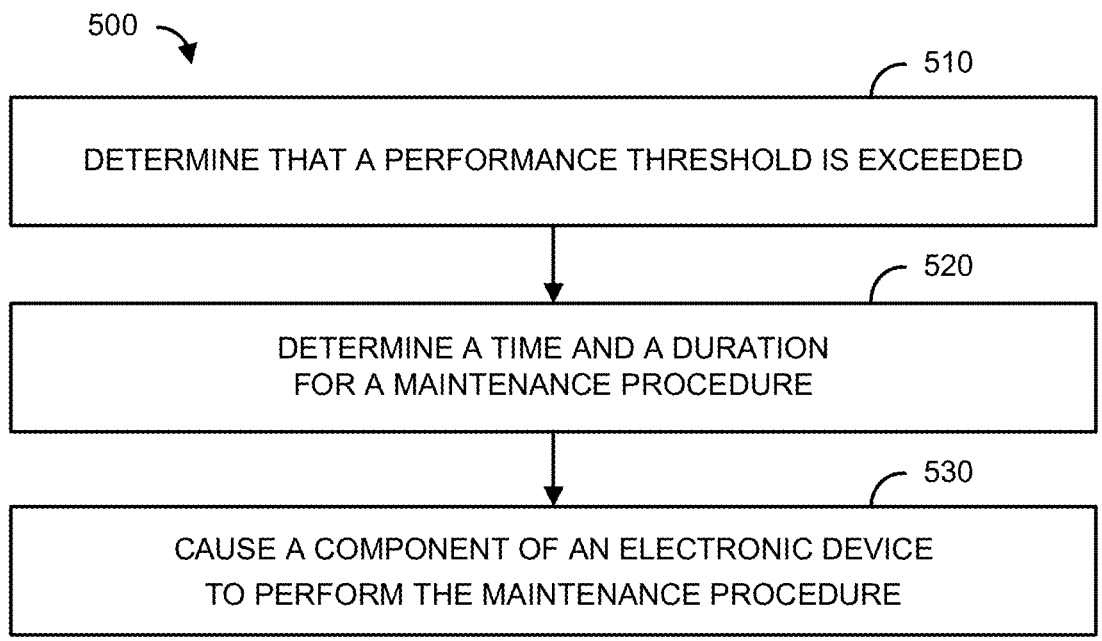

METHODS AND SYSTEMS FOR DEVICE MAINTENANCE AND CONTROL

BACKGROUND

Hardware components of electronic devices generate thermal energy during operation. For example, a computing device may generate relatively high levels of thermal energy when processing certain types of complex data. The electronic device may include a cooling component, such as a fan, that is designed to dissipate the generated thermal energy in order to maintain an optimal operating temperature of the electronic device and to prevent overheating. However, fans are prone to dust buildup, as their sole function is to draw outside, cooler air into the electronic device's chassis and to direct airflow upwards to dissipate the generated thermal energy. As a result, the fan may fail due to wear and tear before other components of the electronic device fail. Additionally, replacing the fan after it has failed may be overly cumbersome and necessitate a replacement of the electronic device. Most electronic devices are designed to have an operational lifespan that is longer than an average operational lifespan of most fans. Thus, what is needed are methods and systems to improve hardware controls of electronic devices and cooling components thereof. These and other considerations are addressed by the present description.

SUMMARY

It is to be understood that both the following general description and the following detailed description are exemplary and explanatory only and are not restrictive. Methods and systems for hardware control are described herein. An electronic device, such as a computing device, may generate thermal energy during operation. The electronic device may have a cooling component, such as a fan, that is disposed within or proximate to the electronic device. The cooling component may be designed to dissipate excess thermal energy in order to maintain an optimal operating temperature of the electronic device and to prevent overheating. The electronic device may include a plurality of sensors that may be used to determine one or more hardware parameters. The electronic device may determine that the cooling component is exceeding a performance threshold based on the one or more hardware parameters.

The electronic device may determine at least one usage parameter (e.g., in response to the performance threshold being exceeded). The at least one usage parameter may include a utilization rate for each of a plurality of hardware modules (such as communication modules) of the electronic device during each of a plurality of time intervals. The electronic device may use the at least one usage parameter to determine a time and a duration for performing a maintenance procedure.

In some examples, the electronic device may cause the cooling component to perform the maintenance procedure at the determined time and for the determined duration. In other examples, the electronic device may provide the one or more hardware parameters and the at least one usage parameter to another electronic device, such as a control device in communication with the electronic device. In such examples, the control device may determine the time and the duration for performing the maintenance procedure rather than the computing device, and the control device may send an instruction to the electronic device that causes the cooling component to perform the maintenance procedure at the determined time for the determined duration.

This summary is not intended to identify critical or essential features of the disclosure, but merely to summarize certain features and variations thereof. Other details and features will be described in the sections that follow.

BRIEF DESCRIPTION OF THE DRAWINGS

The accompanying drawings, which are incorporated in and constitute a part of the present description serve to explain the principles of the methods and systems described herein:

FIG. 5 shows a flowchart of an example method for hardware control.

DETAILED DESCRIPTION

Figure 1:
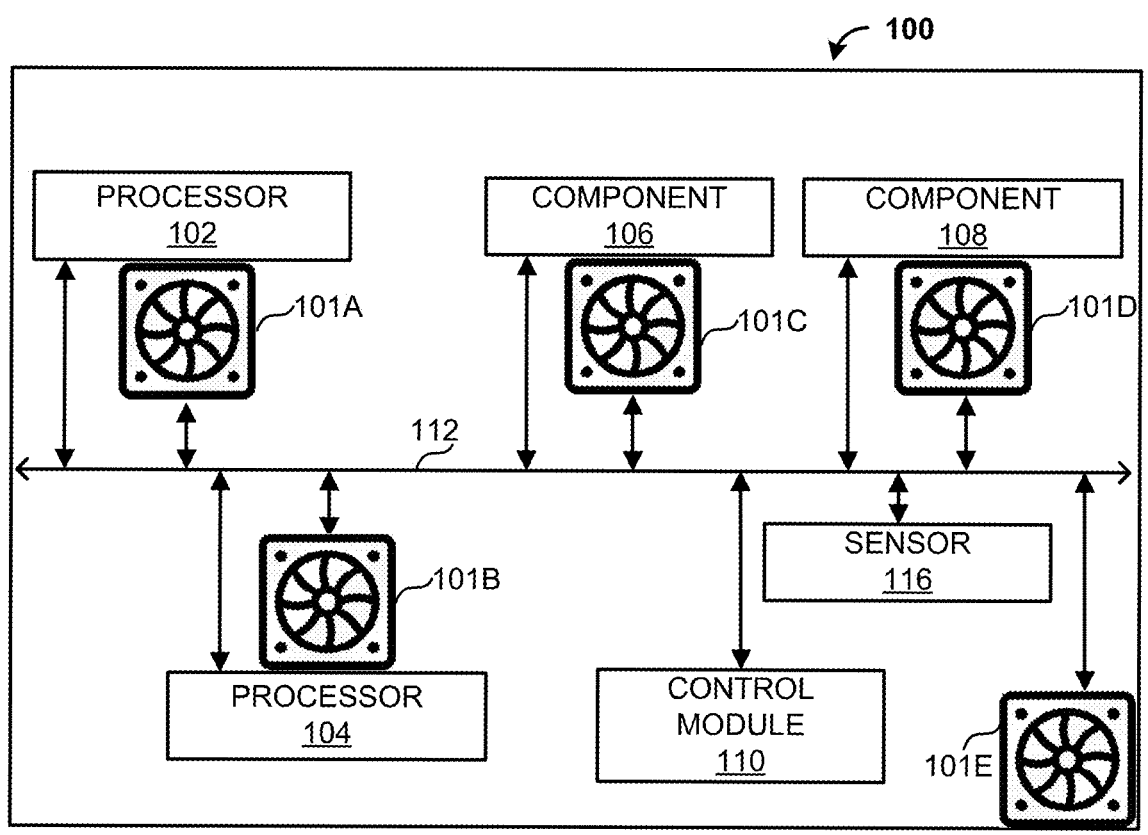
FIG. 1 shows an example electronic device.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another configuration includes from the one particular value and/or to the other particular value. Similarly, when values are expressed as approximations, by use of the antecedent "about," it will be understood that the particular value forms another configuration. It will be further understood that the endpoints of each of the ranges are significant both in relation to the other endpoint, and independently of the other endpoint.

"Optional" or "optionally" means that the subsequently described event or circumstance may or may not occur, and that the description includes cases where said event or circumstance occurs and cases where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal configuration. "Such as" is not used in a restrictive sense, but for explanatory purposes.

It is understood that when combinations, subsets, interactions, groups, etc. of components are described that, while specific reference of each various individual and collective combinations and permutations of these may not be explicitly described, each is specifically contemplated and described herein. This applies to all parts of this application including, but not limited to, steps in described methods. Thus, if there are a variety of additional steps that may be performed it is understood that each of these additional steps may be performed with any specific configuration or combination of configurations of the described methods.

As will be appreciated by one skilled in the art, hardware, software, or a combination of software and hardware may be implemented. Furthermore, a computer program product on a computer-readable storage medium (e.g., non-transitory) having processor-executable instructions (e.g., computer software) embodied in the storage medium. Any suitable computer-readable storage medium may be utilized including hard disks, CD-ROMs, optical storage devices, magnetic storage devices, memresistors, Non-Volatile Random Access Memory (NVRAM), flash memory, or a combination thereof.

Throughout this application reference is made to block diagrams and flowcharts. It will be understood that each block of the block diagrams and flowcharts, and combinations of blocks in the block diagrams and flowcharts, respectively, may be implemented by processor-executable instructions. These processor-executable instructions may be loaded onto a general purpose computer, special purpose computer, or other programmable data processing apparatus to produce a machine, such that the processor-executable instructions which execute on the computer or other programmable data processing apparatus create a device for implementing the functions specified in the flowchart block or blocks.

These processor-executable instructions may also be stored in a computer-readable memory that may direct a computer or other programmable data processing apparatus to function in a particular manner, such that the processor-executable instructions stored in the computer-readable memory produce an article of manufacture including processor-executable instructions for implementing the function specified in the flowchart block or blocks. The processor-executable instructions may also be loaded onto a computer or other programmable data processing apparatus to cause a series of operational steps to be performed on the computer or other programmable apparatus to produce a computer-implemented process such that the processor-executable instructions that execute on the computer or other programmable apparatus provide steps for implementing the functions specified in the flowchart block or blocks.

Blocks of the block diagrams and flowcharts support combinations of devices for performing the specified functions, combinations of steps for performing the specified functions and program instruction means for performing the specified functions. It will also be understood that each block of the block diagrams and flowcharts, and combinations of blocks in the block diagrams and flowcharts, may be implemented by special purpose hardware-based computer systems that perform the specified functions or steps, or combinations of special purpose hardware and computer instructions.

This detailed description may refer to a given entity performing some action. It should be understood that this language may in some cases mean that a system (e.g., a computer) owned and/or controlled by the given entity is actually performing the action.

Described herein are methods and systems for hardware control. An electronic device may generate thermal energy during operation. The electronic device may be, for example, a computing device, such as a gateway device, a router, a personal computer, a server, etc.; an amplifier; a sensor; a display; a speaker; a power adapter; an appliance; and/or the like. The electronic device may have a cooling component, such as a fan, that is disposed within or proximate to the electronic device. For example, a cooling component disposed within the electronic device may be affixed or coupled to a component of the electronic device, such as a processor; a communication module; a transceiver; and/or the like. As another example a cooling component may be proximate to the electronic device, such as being affixed to or nearby an interior or exterior surface of the electronic device. The cooling component may be designed to dissipate excess thermal energy in order to maintain an optimal operating temperature of the electronic device and to prevent overheating thereof. The electronic device may include a plurality of sensors that may be used to determine one or more performance characteristics, such as various mechanical and/or physical characteristics. Such characteristics are generally referred to herein as hardware parameters.

The one or more hardware parameters may include an internal temperature within the electronic device, a temperature of a component of the electronic device, a rotational speed of the cooling component, a difference in the internal temperature over a period of time, a combination thereof, and/or the like. The electronic device may determine that the cooling component is exceeding a performance threshold based on the one or more hardware parameters. For example, the cooling component may be a fan, and a hardware parameter may be a present rotational speed of the fan. The performance threshold may be exceeded when the present rotational speed is less than a threshold rotational speed associated with a present level of voltage provided to the fan (e.g., a voltage level of X volts should produce a rotational speed between A and B rotations-per-minute). As another example, a hardware parameter may be a present temperature within (e.g., inside) the electronic device. The performance threshold may be exceeded when the present temperature is above a first temperature threshold (e.g., a maximum operating temperate, or a range thereof). As a further example, a hardware parameter may be a difference between the present temperature within the electronic device and a previous temperature within the electronic device. The performance threshold may be exceeded when an absolute value of the difference is greater than a second temperature threshold (e.g., the difference may be 10 degrees, while the second temperature threshold may be 8 degrees).

The electronic device may determine at least one usage parameter (e.g., in response to the performance threshold being exceeded). The at least one usage parameter may include a utilization rate for each of a plurality of hardware modules of the electronic device during each of a plurality of time intervals. Each of the plurality of hardware modules may be one or more of a communication module; a transceiver; a motherboard component; a sensor; a memory; a video card; a peripheral device; an optical drive; a resistor; a capacitor; and/or the like. The electronic device may use the at least one usage parameter to determine a time associated with relatively low usage. The electronic device may determine that the time associated with relatively low usage may be used to perform a maintenance procedure. The electronic device may determine a duration for performing the maintenance procedure based on the at least one usage parameter. The maintenance procedure may include causing the fan to rotate in an opposite direction and/or in a preconfigured pattern (e.g., to create a pulsing effect) to dislodge dust and/or other fouling mechanisms. The plurality of hardware modules may include, for example, an 802.11 radio, a Bluetooth radio, a ZigBee radio, an Ethernet gateway, and/or the like. A high utilization rate for a communication module may be indicative of the electronic device, such as a gateway device or a set-top box, processing high-priority network traffic, such as video content. A low utilization rate for a communication module may be indicative of the electronic device processing low-priority network traffic, such as software updates or device backup.

When determining the time and the duration for the maintenance procedure, the electronic device may determine one or more network traffic types for each of the plurality of hardware modules that is processed during each of the plurality of intervals of time. The one or more network traffic types may include the high-priority network traffic and the low-priority network traffic. The electronic device may use the utilization rates and the one more network traffic types to determine the time for performing the maintenance procedure. For example, the electronic device may determine at least one interval of time that is associated with the low-priority network traffic and a lowest utilization rate for at least one of the plurality of hardware modules. The time for performing the maintenance procedure may correspond to the at least one interval of time (e.g., a period of time during a day). The duration for performing the maintenance procedure may correspond to a length of time that is based on the interval of time (e.g., interval of time may between 2:00 AM and 4:15 AM, and the duration of time may be at most 2 hours and 15 minutes). The duration may fixed (e.g., a set amount of time) or it may be dynamic.

In some examples, the electronic device may cause the cooling component to perform the maintenance procedure at the determined time and for the determined duration. In other examples, the electronic device may provide the one or more hardware parameters and the at least one usage parameter to a control device in communication with the computing device. The control device may be a component of the electronic device (e.g., an integrated control device), or it may be separate from the electronic device (e.g., a remotely located control device). In such examples where a control device is present, the control device may determine the time and the duration for performing the maintenance procedure rather than the electronic device, and the control device may send an instruction to the electronic device—or directly to a cooling component thereof—that causes the cooling component to perform the maintenance procedure at the determined time for the determined duration.

In further examples, the control device may be in communication with other electronic devices. One or more of the electronic devices may provide one or more performance characteristics, such as various mechanical and/or physical characteristics, and at least one usage parameter to the control device. Such performance characteristics are generally referred to herein as hardware parameters. The control device may determine a time and a duration for the maintenance procedure to be performed by one or more of the electronic devices. The control device may send an instruction to each of the one or more of the electronic devices or directly to each cooling component thereof. Each instruction may cause each cooling component of each of the one or more of the electronic devices to perform the maintenance procedure at the determined time for the determined duration.

FIG. 1 shows an example electronic device 100. As discussed herein, electronic devices may generate thermal energy during operation. The electronic device may include one or more cooling components. As shown in FIG. 1, the electronic device 100 may include a plurality of cooling components 101A-101E that are disposed within or proximate to the electronic device 100. Each of the plurality of cooling components 101A-101E may be a cooling fan. The electronic device 100 may have one or more processors, such as a first processor 102 and a second processor 104. The cooling component 101A may be disposed within the electronic device 100 and affixed or coupled to the first processor 102 or a heatsink thereof. In a similar manner, the cooling component 101B may be disposed within the electronic device 100 and affixed or coupled to the second processor 104 or a heatsink thereof. The electronic device 100 may have one or more components, such as a first component 106 and a second component 108. Each of the first component 106 and the second component 108 may be a communication module; a transceiver; a motherboard component; a sensor; a memory; a video card; a peripheral device; an optical drive; a resistor; a capacitor; and/or the like. The cooling component 101C may be disposed within the electronic device 100 and affixed or coupled to the first component 106 or a heatsink thereof. In a similar manner, the cooling component 101D may be disposed within the electronic device 100 and affixed or coupled to the second component 108 or a heatsink thereof.

One or more of the plurality of cooling components 101A-101E may be proximate to the electronic device 100, such as being affixed to or nearby an interior or exterior surface of the electronic device 100. For example, the cooling component 101E may be located within or proximate to the electronic device 100 in order to dissipate excess thermal energy and to maintain an optimal operating temperature of the electronic device 100 and to prevent overheating thereof. The cooling component 101E may be affixed to or nearby an interior surface and/or an opening of the electronic device 100 (e.g., a ventilation duct/opening) such that the cooling device 100E may draw air into and/or out of the electronic device 100.

The electronic device 100 may include one or more sensors 116 that may be used to determine one or more performance characteristics such as various mechanical and/or physical characteristics. Such performance characteristics are generally referred to herein as hardware parameters. For ease of explanation, the electronic device 100 is shown as having a single sensor 116, however, it is to be understood that the electronic device 100 may have a plurality of sensors 116. The one or more hardware parameters may include an internal temperature within the electronic device 100, a rotational speed of one or more of the plurality of cooling components 101A-101E, a difference in the internal temperature over a period of time, a combination thereof, and/or the like. The electronic device 100 may determine that one or more of the plurality of cooling components 101A-101E is exceeding a performance threshold based on the one or more hardware parameters. For example, the sensor 116 may be a rotational speed sensor for one or more of the plurality of cooling components 101A-101E, and a performance threshold may be exceeded when a present rotational speed for one or more of the plurality of cooling components 101A-101E is less than a threshold rotational speed associated with a present level of voltage provided to the cooling component(s) (e.g., a voltage level of X volts should produce a rotational speed between A and B rotations-per-minute). As another example, the sensor 116 may be a temperature sensor, and a hardware parameter may be a present temperature within (e.g., inside) the electronic device 100. The performance threshold may be exceeded when the present temperature is above a first temperature threshold (e.g., a maximum operating temperate, or a range thereof). As a further example, a hardware parameter may be a difference between the present temperature within the electronic device 100 and a previous temperature within the electronic device 100. The performance threshold may be exceeded when an absolute value of the difference is greater than a second temperature threshold (e.g., the difference may be 10 degrees, while the second temperature threshold may be 8 degrees).

The sensor 116 may collect telemetry from one or both of the component 106 and the component 108. The electronic device 100 may determine at least one usage parameter using the telemetry collected by the sensor 116 from one or both of the component 106 and the component 108. For example, the component 106 may be a communication module, such an 802.11 radio, a Bluetooth radio, a ZigBee radio, an Ethernet gateway, and/or the like, and the at least one usage parameter may include a utilization rate for the component 106 during each of a plurality of time intervals. The electronic device 100 may use the at least one usage parameter to determine a time and a duration for performing a maintenance procedure, such as causing one or more of the plurality of cooling components 101A-101E to rotate in an opposite direction and/or in a preconfigured pattern (e.g., to create a pulsing effect) to dislodge dust and/or other fouling mechanisms.

When determining the time and the duration for the maintenance procedure, the electronic device may 100 determine one or more network traffic types that is processed by the component 106 during each of the plurality of intervals of time. The one or more network traffic types may include high-priority network traffic and low-priority network traffic. The electronic device 100 may use the utilization rate and the one more network traffic types to determine the time for performing the maintenance procedure. For example, the electronic device 100 may determine at least one interval of time that is associated with low-priority network traffic and a lowest utilization rate for the component 106. The time for performing the maintenance procedure may correspond to the at least one interval of time (e.g., a period of time during a day). The duration for performing the maintenance procedure may correspond to a length of time that is based on the interval of time (e.g., interval of time may between 2:00 AM and 4:15 AM, and the duration of time may be at most 2 hours and 15 minutes). The duration may fixed (e.g., a set amount of time) or it may be dynamic.

The electronic device 100 may have a control module 110. The control module 110 may receive the one or more hardware parameters and the at least one usage parameter. The control device 100 may cause the one or more of the plurality of cooling components 101A-101E to perform the maintenance procedure at the determined time and for the determined duration. The control device 110 may be a component of the electronic device 100 (e.g., an integrated control device), or it may be separate from the electronic device (e.g., a remotely located control device—not shown in FIG. 1). The control device 110 may send an instruction directly to the one or more of the plurality of cooling components 101A-101E that causes the maintenance procedure to be performed at the determined time for the determined duration.

Figure 2A:
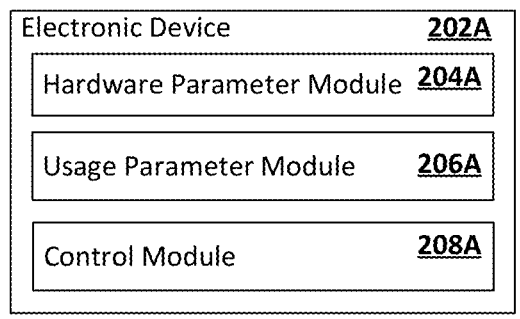
FIGS. 2A-2C show example configurations of a hardware control system.
Figure 2B:
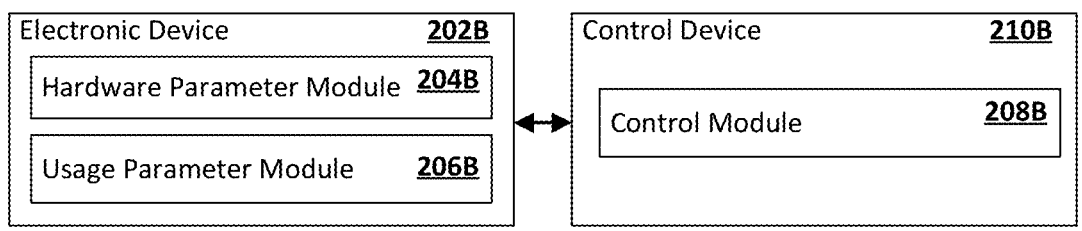
Figure 2C:
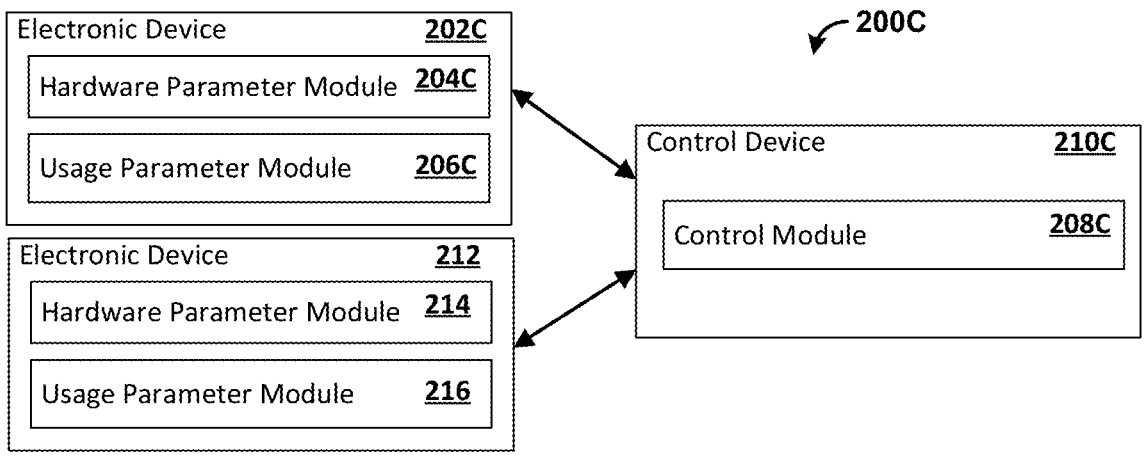
Figure 4A:
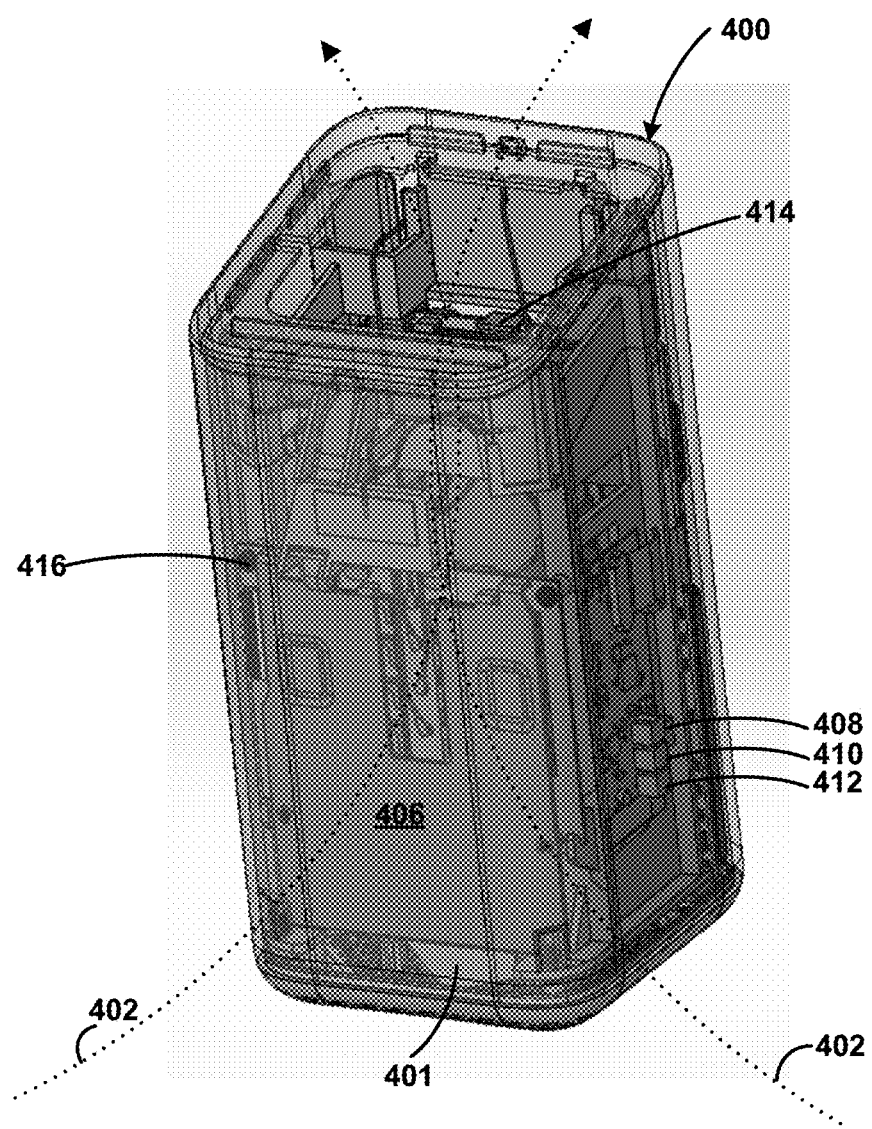
FIGS. 4A and 4B show an example computing device.
Figure 4B:
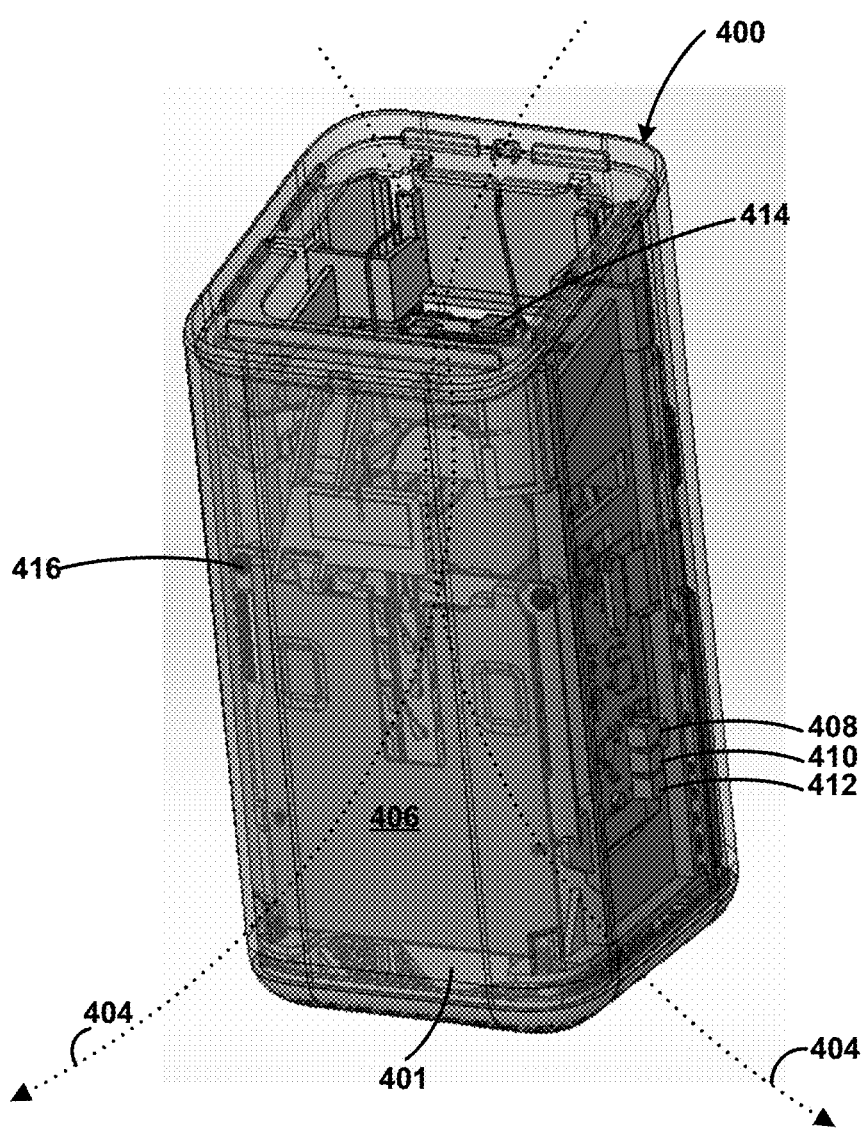

Turning now to FIGS. 2A-2C, example systems 200A, 200B, and 200C for hardware control are shown. As shown in FIG. 2A, the system 200A may include a single electronic device 202A, such as the electronic device 100 of FIG. 1, a gateway device as shown in FIGS. 4A and 4B, a router, a modem, a laptop, a tablet, or any other electronic device that generates thermal energy during operation. The electronic device 202A may have a hardware parameter module 204A, a usage parameter module 206A, and a control module 208A. The electronic device 202A may have one or more cooling components (not shown), such as one or more of the cooling components 101A-101E of FIG. 1, that are disposed within or proximate to the electronic device 202A. The cooling component(s) may be in communication with the control module 208A. That is, the control module 208A may control operation of the cooling component. The cooling component may be designed to dissipate excess thermal energy in order to maintain an optimal operating temperature of the electronic device 202A and to prevent overheating thereof.

The hardware parameter module 204A may include a plurality of sensors, such as those described herein with reference to FIGS. 4A and 4B, which may be used to collect telemetry related to a hardware component(s) of the electronic device 202A and to determine one or more performance characteristics, such as various mechanical and/or physical characteristics. Such performance characteristics are generally referred to herein as hardware parameters. For example, the one or more hardware parameters may include an internal temperature within the electronic device 202A, an operational parameter of the cooling component, a difference in the internal temperature over a period of time, a combination thereof, and/or the like. The electronic device 202A may determine that the cooling component is exceeding a performance threshold based on the one or more hardware parameters. For example, the cooling component may be a fan, and a hardware parameter may be based on an operational parameter associated with the fan, such as a present rotational speed and an amount of voltage supplied to the fan. The performance threshold may be exceeded when the present rotational speed is less than a threshold rotational speed associated with the present level of voltage provided to the fan. As an example, the hardware parameter module 204A may indicate that the present voltage being supplied to the fan is X volts. The electronic device 202A may determine that the fan should be rotating within a range between A and B rotations-per-minute based on the present voltage being X volts. The hardware parameter module 204A may indicate that the present rotational speed is not within the range of between A and B rotations-per-minute, and the electronic device 202A may determine that the cooling component is exceeding a performance threshold based on the one or more hardware parameters.

As another example, a hardware parameter may be a present temperature within the electronic device 202A. The performance threshold may be exceeded when the present temperature is above a first temperature threshold (e.g., a maximum operating temperate, or a range thereof). As a further example, a hardware parameter may be a difference between the present temperature within the electronic device 202A and a previous temperature within the electronic device 202A. The previous temperature may be associated with a time period prior to the electronic device 202A causing the cooling component to perform a maintenance procedure as described herein, and the present temperature may be associated with a current time period starting after the maintenance procedure was performed. The electronic device 202A may determine the performance threshold is exceeded when an absolute value of the difference (e.g., a difference between the temperature before and after performing the maintenance procedure) is greater than a second temperature threshold (e.g., the difference may be 8 degrees, while the second temperature threshold may be 10 degrees). This may indicate that the maintenance procedure was not effective, since the present temperature has not changed by an amount indicated by the second temperature threshold.

The usage parameter module 206A may collect telemetry related to one or more hardware modules of the electronic device 202A, such as the component 106 and/or the component 108. Each of the one or more hardware modules may be one or more of a communication module; a transceiver;

a motherboard component; a sensor; a memory; a video card; a peripheral device; an optical drive; a resistor; a capacitor; and/or the like. The one or more hardware modules may include, for example, an 802.11 radio, a Bluetooth radio, a ZigBee radio, an Ethernet gateway, and/or the like. The electronic device 202A may determine at least one usage parameter based on the telemetry collected by the usage parameter module 206A. The at least one usage parameter may include a utilization rate for each of the one or more hardware modules during each of a plurality of time intervals, such as an amount of seconds, minutes, or hours during a time period, such as a day. The at least one usage parameter may be associated with a network traffic type based on one or more packets of data that are processed by the one or more hardware modules. The traffic type may be determined by the usage parameter module 206A to be high-priority traffic, such as Internet Protocol video, or low-priority traffic, such as routine software updates. The utilization rate during one of the plurality of time intervals may be, for example, a number of packets processed (e.g., send and/or received). In some examples, the at least one usage parameter is not associated with a network traffic type. In such examples, a high utilization rate for a communication module may be indicative of the electronic device 202A processing high-priority network traffic, such as video content, while a low utilization rate for the communication module may be indicative of the electronic device 202A processing low-priority network traffic, such as software updates or device backup data.

The electronic device 202A may use the at least one usage parameter (e.g., the determined utilization rate(s) and/or the associated traffic type(s)) to determine a time and a duration for performing a maintenance procedure as described herein. As an example, the cooling component may be a fan, and the electronic device 202A may determine that the cooling component is exceeding a performance threshold based on the one or more hardware parameters as indicated by the hardware parameter module 204A. The maintenance procedure may therefore include causing the fan to rotate in an opposite direction and/or in a preconfigured pattern (e.g., to create a pulsing effect) at the determined time and for the determined duration in order to dislodge dust and/or other fouling mechanisms. When determining the time and the duration for the maintenance procedure, the electronic device 202A may determine at least one interval of time that is associated with a lowest utilization rate for the one or more hardware modules. The lowest utilization rate may be associated with a low-priority network traffic type. The time for performing the maintenance procedure may correspond to the at least one interval of time (e.g., a period of time during a day). The duration for performing the maintenance procedure may correspond to a length of time that is based on the interval of time. For example, the interval of time may between 2:00 AM and 4:15 AM, and the duration of time may be at most 2 hours and 15 minutes (e.g., the entire interval of time). The duration may fixed (e.g., a set amount of time) or it may be dynamic. For example, the electronic device 202A may monitor the one or more hardware parameters (e.g., via the plurality of sensors) while the maintenance procedure is being performed. A change in the one or more hardware parameters may indicate the maintenance procedure is effectively dislodging dust and/or other fouling mechanisms from the fan (e.g., based on an increased rotational speed). In this way, the electronic device 202A may cause the maintenance procedure to be performed a minimal duration that is sufficient to cause the one or more hardware parameters not to exceed the performance threshold.

The electronic device 202A may cause the control module 208A to cause the cooling component to perform the maintenance procedure at the determined time and for the determined duration. The electronic device 202A may receive further telemetry from the hardware parameter module 204A that indicates the cooling component is still exceeding the performance threshold (or another performance threshold). The electronic device 202A may cause the control module 208A to cause the cooling component to perform the maintenance procedure a second time (or more). The maintenance procedure may be performed at the determined time and for the determined duration, or it may be performed at a second time for a second duration. For example, the electronic device 202A may receive further telemetry from the usage parameter module 206A indicating at least one further usage parameter, and the electronic device 202A may use the at least one further usage parameter to determine the second time and the second duration for performing the maintenance procedure.

As discussed herein, the cooling component may be a fan. In addition to the determined time and the determined duration, the electronic device 202A may use the one or more hardware parameters to determine a rotational speed for the fan during performance of a maintenance procedure as described herein. For example, the electronic device 202A may cause the control module 208A to cause the cooling component to perform the maintenance procedure at a first rotational speed (e.g., 500 RPMs). The electronic device 202A may receive further telemetry from the hardware parameter module 204A that indicates the cooling component is still exceeding the performance threshold (or another performance threshold), thereby indicating the cooling component may still be obstructed by foreign particles. The electronic device 202A may cause the control module 208A to cause the cooling component to perform the maintenance procedure a second time (or more) at a second rotational speed (e.g., 1,000 RPMs). The electronic device 202A may receive additional telemetry from the usage parameter module 206A after the second (or more) performance of the maintenance procedure at the second rotational speed. The additional telemetry may indicate the cooling component is no longer exceeding the performance threshold, thereby indicating the cooling component is no longer obstructed by the foreign particles.

By varying the rotational speed during iterations of performance of the maintenance procedure, the electronic device 202A may ensure the cooling component is not damaged when performing the maintenance procedure (e.g., avoid breaking one or more fan blades when the foreign particles are relatively large and/or hard). Additionally, varying the rotational speed during iterations of performance of the maintenance procedure may ensure the foreign particles are not caused to be spread out proximate to the electronic device 202A (e.g., avoiding dust from suddenly being emitted into the air). Further, varying the rotational speed during iterations of performance of the maintenance procedure may ensure noise caused by the cooling component is not excessive, power is conserved (e.g., lower voltage to avoid spikes in thermal energy), to create a pulsing (e.g., vibrating effect), etc.

Turning now to FIG. 2B, the system 200B is shown. The system 200B may be an alternative configuration of the system 200A and/or the system 200C. As shown in FIG. 2B, the system 200B may include an electronic device 202B and a control device 210B. The electronic device 202B may be a gateway device as shown in FIGS. 4A and 4B, a router, a modem, a laptop, a tablet, or any other computing device that generates thermal energy during operation. The control device 210B may be any suitable computing device that may communicate with the electronic device 202B. The control device 210B and the electronic device 202B may be in communication via wired or wireless means (e.g., directly in signal communication, connected to a network, within a proximity of one another, etc.). The electronic device 202B may have a hardware parameter module 204B and a usage parameter module 206B. The hardware parameter module 204B may function in a similar manner as the hardware parameter module 204A, and the usage parameter module 206B may function in a similar manner as the usage parameter module 206A. The hardware parameter module 204B may include a plurality of sensors, such as those described herein with reference to FIGS. 4A and 4B, which may be used to collect telemetry related to a hardware component(s) of the electronic device 202B and to determine one or more performance characteristics (e.g., hardware parameters) in a similar manner as described with reference to the hardware parameter module 204A. The usage parameter module 206B may collect telemetry related to one or more hardware modules (not shown) of the electronic device 202B and to determine at least one usage parameter in a similar manner as described with reference to the hardware parameter module 204A.

The electronic device 202B may have one or more cooling components (not shown), such as one or more of the cooling components 101A-101E of FIG. 1, that are disposed within or proximate to the electronic device 202B. The cooling component may be in communication with the electronic device 202B and/or the control device 210B. The control device 210B may include a control module 208B that functions in a similar manner as the control module 208A. That is, the control module 208B may control operation of the cooling component of the electronic device 202B by sending an instruction to the electronic device 202B relating to operation of the cooling component. The instruction may cause the cooling component to perform a maintenance procedure as described herein, or the instruction may cause the electronic device 202B to cause the cooling component to perform the maintenance procedure.

As an example, the electronic device 202B may provide the one or more hardware parameters and the at least one usage parameter to the control device 210B. Similar to the electronic device 202A, the control device 210B may determine that the cooling component of the electronic device 202B is exceeding a performance threshold based on the one or more hardware parameters received from the electronic device 202B. Similar to the electronic device 202A, the control device 210B may use the at least one usage parameter received from the electronic device 202B to determine a time and a duration for performing the maintenance procedure. The instruction sent to the electronic device 202B by the control device 210B may include the determined time and the determined duration, and the instruction may cause the electronic device 202B to cause the cooling component to perform the maintenance procedure at the determined time and for the determined duration.

The electronic device 202B may receive further telemetry from the hardware parameter module 204B and determine one or more further hardware parameters. The electronic device 202B may provide the one or more further hardware parameters to the control device 210B. The control device 210B may determine based on the one or more further hardware parameters that the cooling component of the electronic device 202B is still exceeding the performance threshold (or another performance threshold). The control device 210B may send a further instruction to the electronic device 202B. The further instruction may cause the electronic device 202B to cause the cooling component to perform the maintenance procedure a second time (or more). The maintenance procedure may be performed at the determined time and for the determined duration, or it may be performed at a second time for a second duration. For example, the electronic device 202B may receive further telemetry from the usage parameter module 206B and determine at least one further hardware parameter. The electronic device 202B may provide the at least one further hardware parameter to the control device 210B. The control device 210B may determine the second time and the second duration for performing the maintenance procedure based on the at least one further hardware parameter.

Turning now to FIG. 2C, the system 200C is shown. The system 200C may be an alternative configuration of the system 200A and/or the system 200B. As shown in FIG. 2C, the system 200C may include an electronic device 202C, an electronic device 212, and a control device 210C. For ease of explanation, only two electronic devices 202C and 212 and only one control device 210C are shown; however, it is to be understood that the system 200C may include more than two electronic devices and/or more than one control device. The electronic device 202C and/or the electronic device 212 may each be a gateway device as shown in FIGS. 4A and 4B, a router, a modem, a laptop, a tablet, or any other electronic device that generates thermal energy during operation. The control device 210C may be any suitable electronic device that may communicate with the electronic device 202C and the electronic device 212. The control device 210C may be in communication via wired or wireless means (e.g., directly in signal communication, connected to a network, within a proximity of one another, etc.) with the electronic device 202C and the electronic device 212.

The electronic device 202C may have a hardware parameter module 204C and a usage parameter module 206C. The hardware parameter module 204C may function in a similar manner as the hardware parameter module 204A, and the usage parameter module 206C may function in a similar manner as the usage parameter module 206A. The hardware parameter module 204C may include a plurality of sensors, such as those described herein with reference to FIGS. 4A and 4B, which may be used to collect telemetry related to a hardware component(s) of the electronic device 202C and to determine one or more performance characteristics (e.g., hardware parameters) in a similar manner as described with reference to the hardware parameter module 204A. The usage parameter module 206C may collect telemetry related to one or more hardware modules (not shown) of the electronic device 202C and to determine at least one usage parameter in a similar manner as described with reference to the hardware parameter module 204A.

The electronic device 212 may have a hardware parameter module 214 and a usage parameter module 216. The hardware parameter module 214 may function in a similar manner as the hardware parameter module 204A, and the usage parameter module 216 may function in a similar manner as the usage parameter module 206A. The hardware parameter module 214 may include a plurality of sensors, such as those described herein with reference to FIGS. 4A and 4B, which may be used to collect telemetry related to a hardware component(s) of the electronic device 212 and to determine one or more performance characteristics (e.g., hardware parameters) in a similar manner as described with reference to the hardware parameter module 204A. The usage parameter module 216 may collect telemetry related to one or more hardware modules (not shown) of the electronic device 212 and to determine at least one usage parameter in a similar manner as described with reference to the hardware parameter module 204A.

The electronic device 202C may have one or more cooling components, such as one or more of the cooling components 101A-101E of FIG. 1, that are disposed within or proximate to the electronic device 202C. The cooling component may be in communication with the electronic device 202C and/or the control device 210C. The control device 210C may include a control module 208C that functions in a similar manner as the control module 208B. That is, the control module 208C may control operation of the cooling component of the electronic device 202C by sending an instruction to the electronic device 202C relating to operation of the cooling component. The instruction may cause the cooling component to perform a maintenance procedure as described herein, or the instruction may cause the electronic device 202C to cause the cooling component to perform the maintenance procedure.

The electronic device 212 may have one or more cooling components, such as one or more of the cooling components 101A-101E of FIG. 1, that are disposed within or proximate to the electronic device 212. The cooling component may be in communication with the electronic device 212 and/or the control device 210C. The control device 210C may include a control module 208C that functions in a similar manner as the control module 208B. That is, the control module 208C may control operation of the cooling component of the electronic device 212 by sending an instruction to the electronic device 212 relating to operation of the cooling component. The instruction may cause the cooling component to perform a maintenance procedure as described herein, or the instruction may cause the electronic device 212 to cause the cooling component to perform the maintenance procedure.

The electronic device 202C and the electronic device 212 may each provide their corresponding one or more performance characteristics (e.g., hardware parameters) and their corresponding at least one usage parameter to the control device 210C. Similar to the control device 210B, the control device 210C may determine that the cooling component of the electronic device 202C is exceeding a performance threshold based on the one or more hardware parameters received from the electronic device 202C. Additionally, the control device 210C may determine that the cooling component of the electronic device 212 is exceeding a performance threshold based on the one or more hardware parameters received from the electronic device 212. Similar to the control device 210B, the control device 210C may use the at least one usage parameter received from the electronic device 202C to determine a first time and a first duration for the cooling component of the electronic device 202C to perform a maintenance procedure, and the control device 210C may use the at least one usage parameter received from the electronic device 212 to determine a second time and a second duration for the cooling component of the electronic device 212 to perform a maintenance procedure. The first time and the second time may be a same time, or they may be different times (e.g., of a day). The first duration and the second duration may be a same length of time, or they may be different lengths of time. The instruction sent to the electronic device 202C by the control device 210C may include the first time and the first duration, and the instruction may cause the electronic device 202C to cause its cooling component to perform the maintenance procedure at the first time and for the first duration. The instruction sent to the electronic device 212 by the control device 210C may include the second time and the second duration, and the instruction may cause the electronic device 212 to cause its cooling component to perform the maintenance procedure at the second time and for the second duration.

The electronic device 202C may receive further telemetry from the hardware parameter module 204C and determine one or more further hardware parameters. The electronic device 202C may provide the one or more further hardware parameters to the control device 210C. The control device 210C may determine based on the one or more further hardware parameters that the cooling component of the electronic device 202C is still exceeding the performance threshold (or another performance threshold). The control device 210C may send a further instruction to the electronic device 202C. The further instruction may cause the electronic device 202C to cause its cooling component to perform the maintenance procedure a second time (or more). The maintenance procedure may be performed at the first time and for the first duration, or it may be performed at a third time for a third duration. For example, the electronic device 202C may receive further telemetry from the usage parameter module 206C and determine at least one further hardware parameter. The electronic device 202C may provide the at least one further hardware parameter to the control device 210C. The control device 210C may determine the third time and the third duration for performing the maintenance procedure based on the at least one further hardware parameter. The first time and the third time may be a same time, or they may be different times (e.g., of a day). The first duration and the third duration may be a same length of time, or they may be different lengths of time.

The electronic device 212 may receive further telemetry from the hardware parameter module 214 and determine one or more further hardware parameters. The electronic device 212 may provide the one or more further hardware parameters to the control device 210C. The control device 210C may determine based on the one or more further hardware parameters that the cooling component of the electronic device 212 is still exceeding the performance threshold (or another performance threshold). The control device 210C may send a further instruction to the electronic device 212. The further instruction may cause the electronic device 212 to cause its cooling component to perform the maintenance procedure a second time (or more). The maintenance procedure may be performed at the second time and for the second duration, or it may be performed at a fourth time for a fourth duration. For example, the electronic device 212 may receive further telemetry from the usage parameter module 216 and determine at least one further hardware parameter. The electronic device 212 may provide the at least one further hardware parameter to the control device 210C. The control device 210C may determine the fourth time and the fourth duration for performing the maintenance procedure based on the at least one further hardware parameter. The second time and the fourth time may be a same time, or they may be different times (e.g., of a day). The second duration and the fourth duration may be a same length of time, or they may be different lengths of time.

Figure 3:
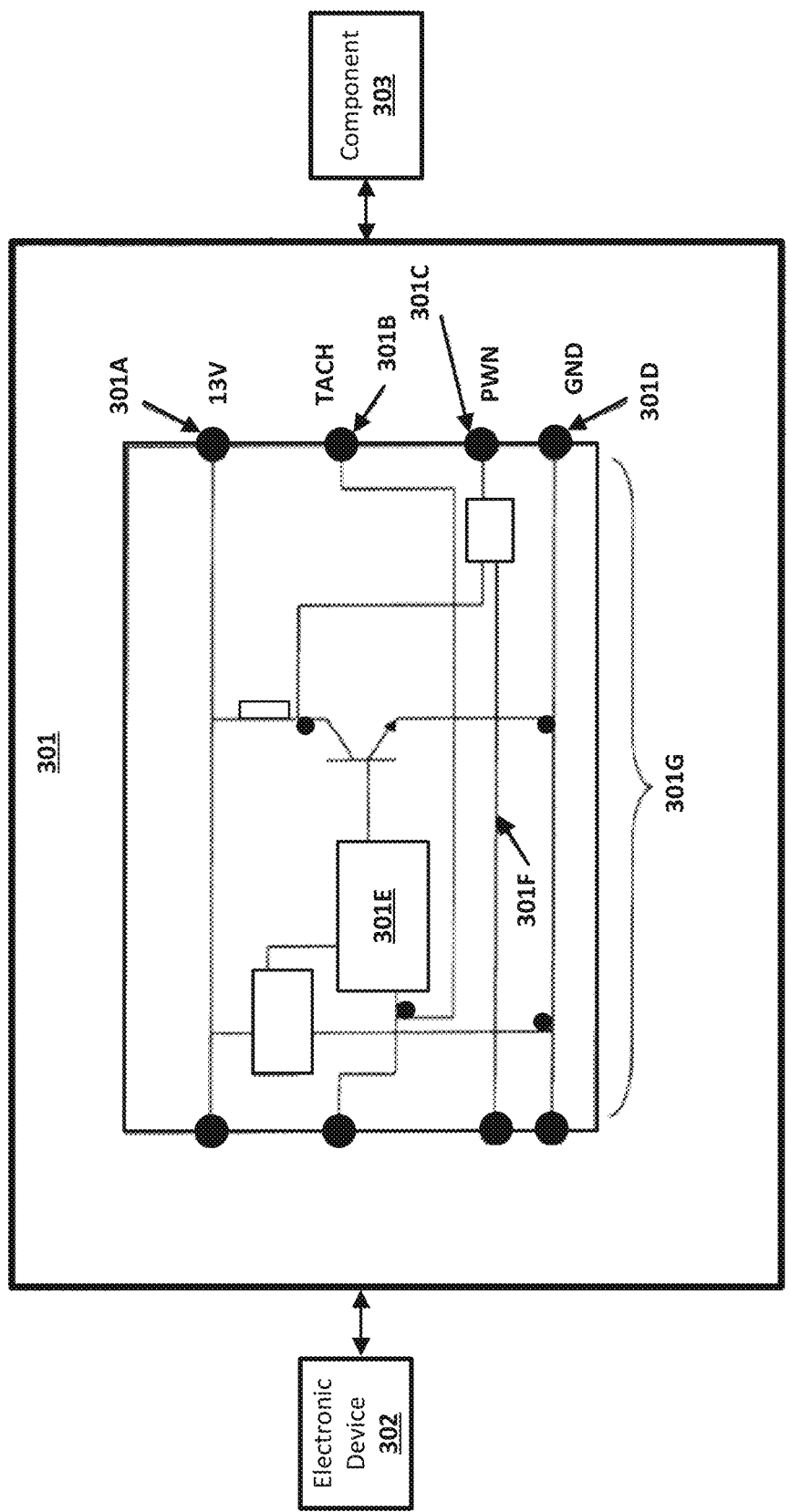
FIG. 3 shows an example hardware control system.

Turning now to FIG. 3, a system 300 for hardware control is shown. The system 300 may include an electronic device 302 (e.g., the electronic device 100, the electronic devices 202A, 202B, 202C, or 212), a control module 301 (e.g., control module 208A, 208B, or 208C), and a cooling component 303. As described herein with respect to FIGS. 2A-2C, each of the electronic devices 202A, 202B, 202C, and 212 may include a cooling component, such as a fan, which may correspond to the component 303 of the system 300. The control module 301 may be part of the electronic device 302, or it may be a separate device, such as the control module 208A, 208B, or 208C. While for ease of explanation the component 303 is shown as a separate device from the electronic device 302, it is to be understood that the component 303 may be part of the electronic device 302. The component 303 may be part of a gateway device as shown in FIGS. 4A and 4B, a router, a modem, a laptop, a tablet, or any other computing device that generates thermal energy during operation.

The control module 301 may be operably coupled to a power source (e.g., a power source of the electronic device 302) and configured to send normal and reverse cycle rotation signals to the component 303. The component 303 may be operably coupled to the control module 301 to receive and interpret the rotation signals and to operate in normal and reverse cycles accordingly (e.g., rotate in a first direction normally, and rotate in an opposite direction when directed). The component 303 may be at a location that is sufficiently proximate to a heat transfer surface(s) of the electronic device 302 such that the normal and reverse cycles of the component 303 may generate first and second opposing air flows with respect to the heat transfer surface(s) of the electronic device 302, respectively, in response to the received and interpreted rotation signals. The heat transfer surface(s) of the electronic device 302 may be a processor heatsink, a circuit board component, or any other component of the electronic device 302 that generates thermal energy during operation.

As described herein, the component 303 may be a fan. The fan may have a brushless direct current (BLDC) motor or other types of motors, such as brushed DC motors, three phase AC synchronous motors, steppers motors or reluctance motors, and/or the like. The component 303 may be used to increase a degree by which the heat transfer surface(s) of the electronic device 302 remove generated thermal energy from associated component of the electronic device 302 (e.g., processor, circuit board, etc.). The component 303 (e.g., fan) may include a plurality of blades that rotate in the first or the second direction to generate the first or the second air flows, respectively. That is, during a normal cycle of operation of the component 303, the first air flow, in which air, which is at least partly drawn from ambient air surrounding the electronic device 302, may be blown by the plurality of blades toward and over the heat transfer surface(s) of the electronic device 302.

As one skilled in the art can appreciate, the ambient air may contain foreign particles, such as dust, which tend to accumulate on and thereby hinder the operation of the heat transfer surface(s) of the electronic device 302 and/or the component 303. As such, the reverse cycle of the component 303 may generate the second air flow in order to dislodge dust and/or other fouling mechanisms from one or both of the heat transfer surface(s) of the electronic device 302 or the component 303. The second air flow, in which air is blown by the plurality of blades of the component 303 in an opposite direction, may remove some or all of the dust and/or other fouling mechanisms.

The component 303 may be operably coupled to the control module 301 by a four-wire cable 310G. The four-wire cable 310G may include a voltage carrying wire (+12) 310A, a grounded wire (GND) 310D, a tachometer output wire (TACH) 310B and a pulse width modulation (PWM) wire 310C. The tachometer output wire 310B allows the component 303 to indicate to the control module 301 a present rotational speed of the component 303. The pulse width modulation (PWM) wire 310C allows the control module 301, which may compare the present rotational speed of the component 303 to a desired/expected speed of rotation, to send a speed-up, a slow-down, or an initiate reverse cycle instruction to the component 303 via a PWM signal 310F.

The control module 301 may include a counter 310E that is configured to allow the control module 301 to determine when to instruct the component 303 to switch between the normal and reverse cycles (e.g., by sending the PWM signal 310F to the component 303 with zero volts) when performing a maintenance procedure. The control module 301 may instruct the component 303 to switch from the normal cycles to one or more reverse cycles as part of performing the maintenance procedure as described herein with respect to FIGS. 2A-2C. The normal cycles of the component 303 may operate continuously (e.g., several days in a row), while the corresponding one or more reverse cycles may last for a much less amount of time (e.g., based on the determined duration(s) described herein with respect to FIGS. 2A-2C). As an example, using the counter 310E, the control module 301 may count tach pulses from the component 303 via the TACH wire 310B. The control module 301 may ground the PWM signal wire 310C for, as an example, about three seconds so as to issue the PWM signal 310F with zero volts. This may result in the reverse cycle of the component 303 (e.g., an opposite rotational direction) lasting for a period of, as an example, about 8 seconds. Subsequently, the PWM signal 310F may be sent to the component 303 normally (e.g., normal voltage) and the component 303 may then resume the normal cycle.

The control module 301 may determine when to activate a reverse cycle(s) of the component 303 based on one or more performance characteristics, such as various mechanical and/or physical characteristics. Such performance characteristics are generally referred to herein as hardware parameters. For example, the one or more hardware parameters may include an internal temperature within the electronic device 302, a rotational speed of the component 303, a difference in the internal temperature over a period of time, a combination thereof, and/or the like. The electronic device 302 may determine that the component 303 is exceeding a performance threshold based on the one or more hardware parameters. As an example, a hardware parameter may be a present rotational speed of the component 303. The PWM wire 310C may indicate to the control module 301 that a present voltage being supplied to the component 303 is X volts. The control module 301 may determine that the component 303 should be rotating within a range between A and B rotations-per-minute based on the present voltage being X volts. The TACH wire 310B may indicate to the control module 301 that the present rotational speed is not within the range of between A and B rotations-per-minute, and the control module 301 may determine that the component 303 is therefore exceeding the performance threshold. In response, the control module 301 may cause the component 303 to perform a maintenance procedure. As another example, a hardware parameter may be a present temperature within the electronic device 302. The performance threshold may be exceeded when the present temperature is above a first temperature threshold (e.g., a maximum operating temperate, or a range thereof). As a further example, a hardware parameter may be a difference between the present temperature within the electronic device 302 and a previous temperature within the electronic device 302. The performance threshold may be exceeded when an absolute value of the difference is greater than a second temperature threshold (e.g., the difference may be 10 degrees, while the second temperature threshold may be 8 degrees). Other hardware parameters may be used, as one skilled in the art can appreciate.

FIGS. 4A and 4B show views of an example gateway device 400 that may implement the methods and systems for hardware control described herein. Any one of the electronic devices 100, 202A, 202B, 202C, 212 and/or 302 may be a gateway device, such as the gateway device 400 shown in FIGS. 4A and 4B. The gateway device 400 may be operably coupled to a power source (not shown). The gateway device 400 may include a cooling component 401, such as a fan (e.g., component 303). During normal operation, such as when hardware parameters are within standard tolerance ranges, the cooling component 401 may not be engaged (e.g., the fan does not rotate). As described further herein, during above-normal operation, such as when any one of the hardware parameters with not within its standard tolerance range, the cooling component 401 may be caused to be engaged (e.g., the fan rotates). The cooling component 401 may be at a location that is sufficiently proximate to a heat transfer surface(s) of the gateway device 400. For example, the gateway device 400 may include one or more processors, network adaptors, network radios, etc., that generate thermal energy during operation—each of which may be a heat transfer surface. The cooling component 401 may be located within, or proximate to, the gateway device 400 such that the cooling component 401 may generate first air flows 402 that pass through the gateway device 400 from bottom to top.

As described herein, the cooling component 401 may be a fan. The fan may have a brushless direct current (BLDC) motor or other types of motors, such as brushed DC motors, three phase AC synchronous motors, steppers motors or reluctance motors, and/or the like. The cooling component 401 may be used to increase a degree by which the heat transfer surface(s) of the gateway device 400 removes generated thermal energy from associated components of the gateway device 400 (e.g., processor, circuit board, etc.). The cooling component 401 may include a plurality of blades that rotate in a first direction to generate the first air flows 402.

The gateway device 400 may include a hardware control module 406 configured to send rotation signals to the cooling component 401. The hardware control module 406 may operate in a similar manner as the control module 301 described herein with respect to FIG. 3. The cooling component 401 may be operably coupled to the hardware control module 406 to receive and interpret the rotation signals and to rotate in the first direction (e.g., clockwise) or in an opposite, second direction (e.g., counter-clockwise). As one skilled in the art can appreciate, the ambient air may contain foreign particles, such as dust, hair, stationary items (e.g., paperclips, staples, paper fragments, pencil shavings, etc.), sand, etc. These foreign particles tend to accumulate on, and thereby hinder the operation of, the cooling component 401 and/or the heat transfer surface(s) of the gateway device 400. As such, the hardware control module 406 may cause the cooling component 401 to rotate in the second direction as part of a maintenance procedure. By rotating in the second direction, the cooling component may generate second air flows 404 as shown in FIG. 4B. The second air flows 404 may pass through the gateway device 400 from top to bottom. The maintenance procedure (e.g., rotating in the second direction) may be performed by the gateway device 400 in order to dislodge dust and/or other fouling mechanisms from one or both of the cooling component 401 or the heat transfer surface(s) of the gateway device 400. The second air flows 404, in which air is blown by the plurality of blades of the cooling component 401 in the second direction, may remove some or all of the dust and/or other fouling mechanisms.

The hardware control module 406 may be configured to determine when to cause the cooling component 401 to rotate in the first direction or in the second direction. The hardware control module 406 may cause the cooling component 401 to switch from the first direction to the second direction as part of performing the maintenance procedure as described herein. The hardware control module 406 may determine when to perform the maintenance procedure based on one or more performance characteristics (e.g., hardware parameters) exceeding a performance threshold. The gateway device 400 may include a plurality of sensors 408, 410, and 412—additional sensors may be included as well—that provide diagnostic and/or telemetry data relating to the operation of the gateway device 400 to the hardware control module 406. For example, the sensor 408 may be a temperature sensor, and a hardware parameter may include an internal temperature within the gateway device 400, a difference in the temperature over a period of time, a combination thereof, and/or the like. As another example, the sensor 410 may be a rotational speed sensor, and a hardware parameter may be a current rotational speed of the cooling component 401.

The hardware control module 406 may determine that the cooling component 401 is exceeding a performance threshold based on a present rotational speed of the cooling component 401. The hardware control module 406 may determine that a present voltage being supplied to the cooling component 401 is X volts, and the cooling component 401 should be rotating within a range between A and B rotations-per-minute based on the present voltage being X volts. The sensor 410 may indicate to the hardware control module 406 that the present rotational speed is not within the range of between A and B rotations-per-minute, and the hardware control module 406 may determine that the cooling component 401 is therefore exceeding the performance threshold. In response, the hardware control module 406 may cause the cooling component 401 to perform the maintenance procedure (e.g., rotate in the second direction).

As described herein, a hardware parameter may be a present internal temperature within the gateway device 400. The performance threshold may be exceeded when the present internal temperature indicated to the hardware control module 406 by the sensor 408 is above a first temperature threshold (e.g., a maximum operating temperate, or a range thereof). As also described herein, a hardware parameter may be a difference between the present internal temperature within the gateway device 400 and a previous temperature within the gateway device 400. The performance threshold may be exceeded when the hardware control module 406 determines an absolute value of the difference is greater than a second temperature threshold (e.g., the difference may be 10 degrees, while the second temperature threshold may be 8 degrees). Other hardware parameters may be used, as one skilled in the art can appreciate.

When the hardware control module 406 determines that a performance threshold has been exceeded, the hardware control module 406 may cause the cooling component 401 to rotate in the second direction at a determined time, such as when the gateway device 400 is determined to be least busy, and for a determined duration (e.g., an amount of time). The determined time and the determined duration may be based on telemetry data reported to the hardware control module 406 by one or more hardware modules 414, 416. Each of the one or more hardware modules 414, 416 may be one or more of a communication module; a transceiver; a motherboard component; a sensor; a memory; a video card; a peripheral device; an optical drive; a resistor; a capacitor; and/or the like. The one or more hardware modules 414, 416 may include, for example, an 802.11 radio, a Bluetooth radio, a ZigBee radio, an Ethernet gateway, a DOCSIS module and/or the like. The hardware control module 406 may determine at least one usage parameter based on the telemetry data reported to the hardware control module 406 by the one or more hardware modules 414, 416. The at least one usage parameter may include a utilization rate for each of the one or more hardware modules 414, 416 during each of a plurality of time intervals, such as an amount of seconds, minutes, or hours during a time period, such as a day. The at least one usage parameter may be associated with a network traffic type based on one or more packets of data that are processed by the one or more hardware modules 414, 416. The traffic type may be determined by the hardware control module 406 to be high-priority traffic, such as Internet Protocol video, or low-priority traffic, such as routine software updates. The utilization rate during one of the plurality of time intervals may be, for example, a number of packets processed (e.g., send and/or received). In some examples, the at least one usage parameter is not associated with a network traffic type. In such examples, a high utilization rate for the one or more hardware modules 414, 416 may be indicative of the gateway device 400 processing high-priority network traffic, such as video content, while a low utilization rate may be indicative of the gateway device 400 processing low-priority network traffic, such as software updates or device backup data.

The hardware control module 406 may use the at least one usage parameter (e.g., the determined utilization rate(s) and/or the associated traffic type(s)) to determine the time and the duration for performing the maintenance procedure as described herein. As an example, the hardware control module 406 may determine that the cooling component 401 is exceeding a performance threshold based on the one or more hardware parameters. The maintenance procedure may therefore include causing the cooling component 401 to rotate in the second direction, in a preconfigured pattern (e.g., to create a pulsing effect), and/or at an increasing or decreasing speed at the determined time and for the determined duration in order to dislodge dust and/or other fouling mechanisms. When determining the time and the duration for the maintenance procedure, the hardware control module 406 may determine at least one interval of time that is associated with a lowest utilization rate for the one or more hardware modules 414, 416. The lowest utilization rate may be associated with a low-priority network traffic type. The time for performing the maintenance procedure may correspond to the at least one interval of time (e.g., a period of time during a day). The duration for performing the maintenance procedure may correspond to a length of time that is based on the interval of time. For example, the interval of time may between 2:00 AM and 4:15 AM, and the duration of time may be at most 2 hours and 15 minutes (e.g., the entire interval of time). The duration may fixed (e.g., a set amount of time) or it may be dynamic. For example, the gateway device 400 may monitor the one or more hardware parameters (e.g., via the plurality of sensors) while the maintenance procedure is being performed. A change in the one or more hardware parameters may indicate the maintenance procedure is effectively dislodging dust and/or other fouling mechanisms from the cooling component 401 (e.g., based on an increased rotational speed of the fan). In this way, the gateway device 400 may cause the maintenance procedure to be performed a minimal duration that is sufficient to cause the one or more hardware parameters not to exceed the performance threshold.

The hardware control module 406 may receive further telemetry data from the one or more hardware modules 414, 416 following performance of the maintenance procedure. The further telemetry data may indicate the cooling component 401 is still exceeding the performance threshold (or another performance threshold). The hardware control module 406 may cause the cooling component 401 to perform the maintenance procedure a second time (or more). The maintenance procedure may be performed at the determined time and for the determined duration, or it may be performed at a second time for a second duration. For example, the hardware control module 406 may receive the further telemetry data indicating at least one further usage parameter, and the hardware control module 406 may use the at least one further usage parameter to determine the second time and the second duration for performing the maintenance procedure.

The hardware control module 406 may receive feedback data from the plurality of sensors 408, 410, 412 during performance of the maintenance procedure. For example, the sensor 410 may indicate an increase in the rotational speed of the cooling component 401 as it rotates in the second direction and dislodges dust and/or other fouling mechanisms. The sensor 410 may indicate the rotational speed of the cooling component 401 is such that it is no longer exceeding the performance threshold. In this way, the hardware control module 406 may use the feedback data to determine that the maintenance procedure was successful.

FIG. 5 shows a flowchart of a method 500 for hardware control in accordance with the present description. The method 500 may be implemented by any of the devices/entities shown in FIGS. 1 and 2, the control module 301 and/or the electronic device 302 of FIG. 3, or the gateway device 400 of FIG. 4. At step 510, an electronic device may determine that a performance threshold is exceeded. The electronic device may determine the performance threshold is exceeded based on at least one hardware parameter. For example, the at least one hardware parameter may be a present rotational speed of a component of the electronic device, such as a fan, and the performance threshold may be exceeded when the present rotational speed is less than a threshold rotational speed associated with a present level of voltage provided to the component. As another example, the at least one hardware parameter may be a present temperature within the electronic device, and the performance threshold may be exceeded when the present temperature is above a first temperature threshold. As a further example, the at least one hardware parameter may be a difference between the present temperature and a previous temperature within the electronic device, and the performance threshold may exceeded when an absolute value of the difference is greater than a second temperature threshold.

At step 520, the electronic device may determine a time and a duration for performing a maintenance procedure. The electronic device may determine the maintenance procedure is necessary in response to determining that the performance threshold has been exceeded. The time and the duration may be determined by the electronic device based on at least one usage parameter associated with the electronic device. For example, the at least one usage parameter may include a utilization rate for each of a plurality of intervals of time for each of a plurality of hardware modules of the electronic device (e.g., an 802.11 radio, a Bluetooth radio, a ZigBee radio, an Ethernet gateway, etc.). In this example, determining the time and the duration for the maintenance procedure may include determining one or more network traffic types processed during each of the plurality of intervals of time for each of the plurality of hardware modules. The one or more network traffic types may include high-priority traffic and/or low-priority traffic. At least one interval of time associated with low-priority traffic and a lowest utilization rate for at least one of the plurality of hardware modules may be determined by the electronic device based on each determined utilization rate and the determined one or more network traffic types. The time and the duration may then be determined based on the at least one interval of time.

At step 530, the electronic device may cause the component to perform the maintenance procedure at the determined time for the determined duration. As an example, the component may be a fan that is proximate to a heatsink (or other heat transfer surface(s)) of the electronic device. The maintenance procedure may include causing the fan to rotate in an opposite direction so as to dislodge dust or other fouling mechanisms.

The electronic device may be one of a plurality of electronic devices in communication with a control device. The electronic device may receive an instruction from the control device regarding the time and the duration for performing the maintenance procedure. The electronic device may cause the component to perform the maintenance procedure in response to receiving the instruction from the control device.

Figure 6:
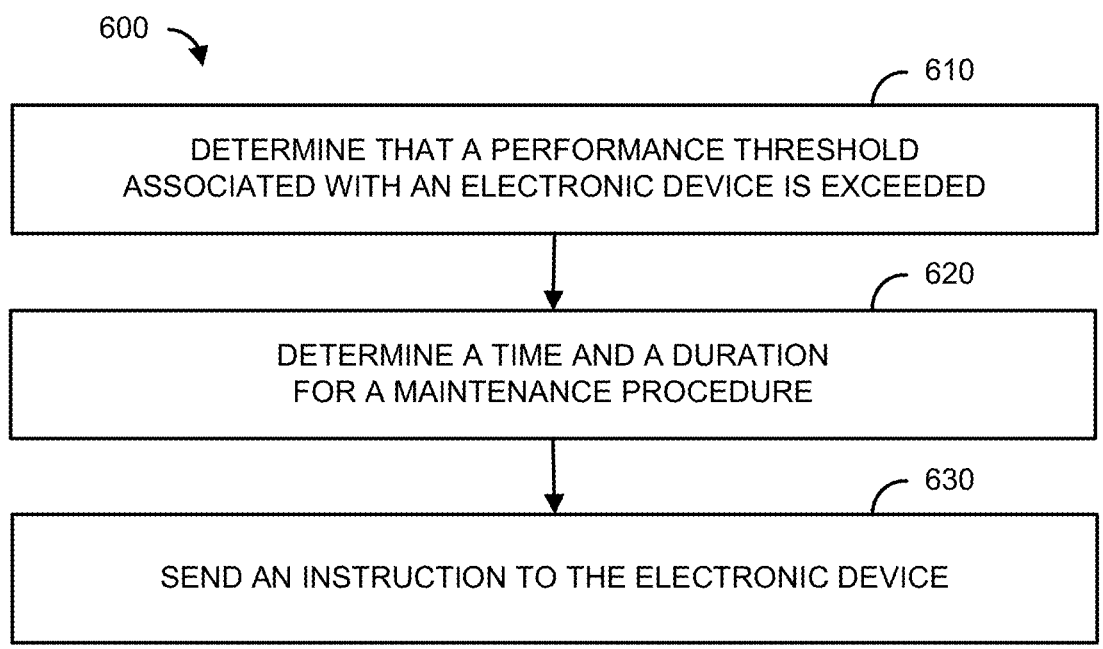
FIG. 6 shows a flowchart of an example method for hardware control.

FIG. 6 shows a flowchart of a method 600 for hardware control in accordance with the present description. The method 600 may be implemented by any of the devices/entities shown in FIGS. 1 and 2, the control module 301 and/or the electronic device 302 of FIG. 3, or the gateway device 400 of FIG. 4. At step 610, a control device may determine that a performance threshold associated with an electronic device, such as a gateway device, is exceeded. The electronic device may be one of a plurality of electronic devices in communication with the control device. The control device may determine the performance threshold is exceeded based on at least one hardware parameter associated with the electronic device. For example, the at least one hardware parameter may be a present rotational speed of a component of the electronic device, such as a fan, and the performance threshold may be exceeded when the present rotational speed is less than a threshold rotational speed associated with a present level of voltage provided to the component. As another example, the at least one hardware parameter may be a present temperature within the electronic device, and the performance threshold may be exceeded when the present temperature is above a first temperature threshold. As a further example, the at least one hardware parameter may be a difference between the present temperature and a previous temperature within the electronic device, and the performance threshold may exceeded when an absolute value of the difference is greater than a second temperature threshold.

At step 620, the control device may determine a time and a duration for causing the component of the electronic device to perform a maintenance procedure. The control device may determine the maintenance procedure is necessary in response to determining that the performance threshold associated with the electronic device has been exceeded. The time and the duration may be determined by the control device based on at least one usage parameter associated with the electronic device. For example, the at least one usage parameter may include a utilization rate for each of a plurality of intervals of time for each of a plurality of hardware modules of the electronic device (e.g., an 802.11 radio, a Bluetooth radio, a ZigBee radio, an Ethernet gateway, etc.). In this example, determining the time and the duration for the maintenance procedure may include determining one or more network traffic types processed during each of the plurality of intervals of time for each of the plurality of hardware modules. The one or more network traffic types may include high-priority traffic and/or low-priority traffic. At least one interval of time associated with low-priority traffic and a lowest utilization rate for at least one of the plurality of hardware modules may be determined by the control device based on each determined utilization rate and the determined one or more network traffic types. The time and the duration may then be determined based on the at least one interval of time.

At step 630, the control device may send an instruction to the electronic device. The instruction may indicate the time and the duration for performing the maintenance procedure. The electronic device may cause the component to perform the maintenance procedure in response to receiving the instruction from the control device. As an example, the component may be a fan that is proximate to a heatsink (or other heat transfer surface(s)) of the electronic device. The maintenance procedure may include the electronic device causing the fan to rotate in an opposite direction so as to dislodge dust or other fouling mechanisms.

As discussed herein, the electronic device may be one of a plurality of electronic devices in communication with the control device. The control device may determine that a second performance threshold associated with a second electronic device of the plurality of electronic devices is exceeded. The control device may determine that the second the second performance threshold is exceeded based on at least one second hardware parameter associated with the second electronic device. The control device may determine a second time and a second duration for a maintenance procedure to be performed by a component (e.g., a fan) of the second electronic device.

The control device may determine a second time and a second duration for causing the component of the second electronic device to perform the maintenance procedure. The control device may determine the maintenance procedure is necessary in response to determining that the second performance threshold associated with the second electronic device has been exceeded. The second time and the second duration may be determined by the control device based on at least one usage parameter associated with the second electronic device. The control device may send a second instruction to the second electronic device. The second instruction may indicate the second time and the second duration for performing the maintenance procedure. The second electronic device may cause the component to perform the maintenance procedure in response to receiving the second instruction from the control device. As an example, the component may be a fan that is proximate to a heatsink (or other heat transfer surface(s)) of the second electronic device. The maintenance procedure may include the second electronic device causing the fan to rotate in an opposite direction so as to dislodge dust or other fouling mechanisms.

Figure 7:
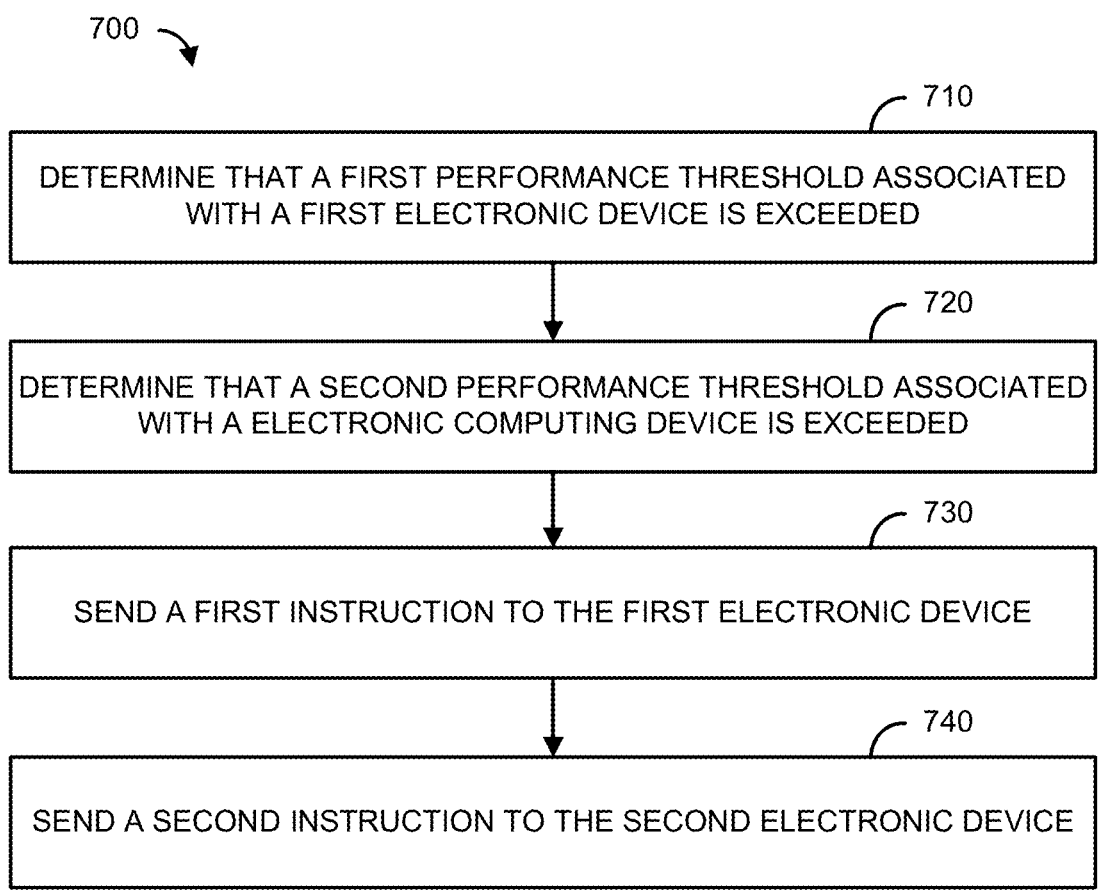
FIG. 7 shows a flowchart of an example method for hardware control.

FIG. 7 shows a flowchart of a method 700 for hardware control in accordance with the present description. The method 700 may be implemented by any of the devices/ entities shown in FIGS. 1 and 2, the control module 301 and/or the electronic device 302 of FIG. 3, or the gateway device 400 of FIG. 4. At step 710, a control device may determine that a performance threshold associated with a first electronic device, such as a gateway device, is exceeded. The first electronic device may be one of a plurality of electronic devices in communication with the control device. The control device may determine the performance threshold is exceeded based on at least one hardware parameter associated with the first electronic device. For example, the at least one hardware parameter may be a present rotational speed of a component of the first electronic device, such as a fan, and the performance threshold may be exceeded when the present rotational speed is less than a threshold rotational speed associated with a present level of voltage provided to the component. As another example, the at least one hardware parameter may be a present temperature within the first electronic device, and the performance threshold may be exceeded when the present temperature is above a first temperature threshold. As a further example, the at least one hardware parameter may be a difference between the present temperature and a previous temperature within the first electronic device, and the performance threshold may exceeded when an absolute value of the difference is greater than a second temperature threshold.

The control device may determine a first time and a first duration for causing the component of the first electronic device to perform a maintenance procedure. The control device may determine the maintenance procedure is necessary in response to determining that the performance threshold associated with the first electronic device has been exceeded. The first time and the first duration may be determined by the control device based on at least one usage parameter associated with the first electronic device. For example, the at least one usage parameter may include a utilization rate for each of a plurality of intervals of time for each of a plurality of hardware modules of the first electronic device (e.g., an 802.11 radio, a Bluetooth radio, a ZigBee radio, an Ethernet gateway, etc.). In this example, determining the first time and the first duration for the maintenance procedure may include determining one or more network traffic types processed during each of the plurality of intervals of time for each of the plurality of hardware modules of the first electronic device. The one or more network traffic types may include high-priority traffic and/or low-priority traffic. At least one interval of time associated with low-priority traffic and a lowest utilization rate for at least one of the plurality of hardware modules of the first electronic device may be determined by the control device based on each determined utilization rate and the determined one or more network traffic types. The first time and the first duration may then be determined based on the at least one interval of time.

At step 720, the control device may determine that a performance threshold associated with a second electronic device, such as a gateway device, is exceeded. The second electronic device may be one of the plurality of electronic devices in communication with the control device. The control device may determine the performance threshold is exceeded based on at least one hardware parameter associated with the second electronic device. For example, the at least one hardware parameter may be a present rotational speed of a component of the second electronic device, such as a fan, and the performance threshold may be exceeded when the present rotational speed is less than a threshold rotational speed associated with a present level of voltage provided to the component. As another example, the at least one hardware parameter may be a present temperature within the second electronic device, and the performance threshold may be exceeded when the present temperature is above the first temperature threshold. As a further example, the at least one hardware parameter may be a difference between the present temperature and a previous temperature within the second electronic device, and the performance threshold may exceeded when an absolute value of the difference is greater than the second temperature threshold.

The control device may determine a second time and a second duration for causing the component of the second electronic device to perform a maintenance procedure. The control device may determine the maintenance procedure is necessary in response to determining that the performance threshold associated with the second electronic device has been exceeded. The second time and the second duration may be determined by the control device based on at least one usage parameter associated with the second electronic device (e.g., in a similar manner as step 710 with respect to the first electronic device).

At step 730, the control device may send a first instruction to the first electronic device. The first instruction may indicate the first time and the first duration for performing the maintenance procedure. The first electronic device may cause the component to perform the maintenance procedure in response to receiving the first instruction from the control device. As an example, the component may be a fan that is proximate to a heatsink (or other heat transfer surface(s)) of the first electronic device. The maintenance procedure may include the first electronic device causing the fan to rotate in an opposite direction so as to dislodge dust or other fouling mechanisms.

At step 740, the control device may send a second instruction to the second electronic device. The second instruction may indicate the second time and the second duration for performing the maintenance procedure. The second electronic device may cause the component to perform the maintenance procedure in response to receiving the second instruction from the control device. As an example, the component may be a fan that is proximate to a heatsink (or other heat transfer surface(s)) of the second electronic device. The maintenance procedure may include the second electronic device causing the fan to rotate in an opposite direction so as to dislodge dust or other fouling mechanisms.

Figure 8:
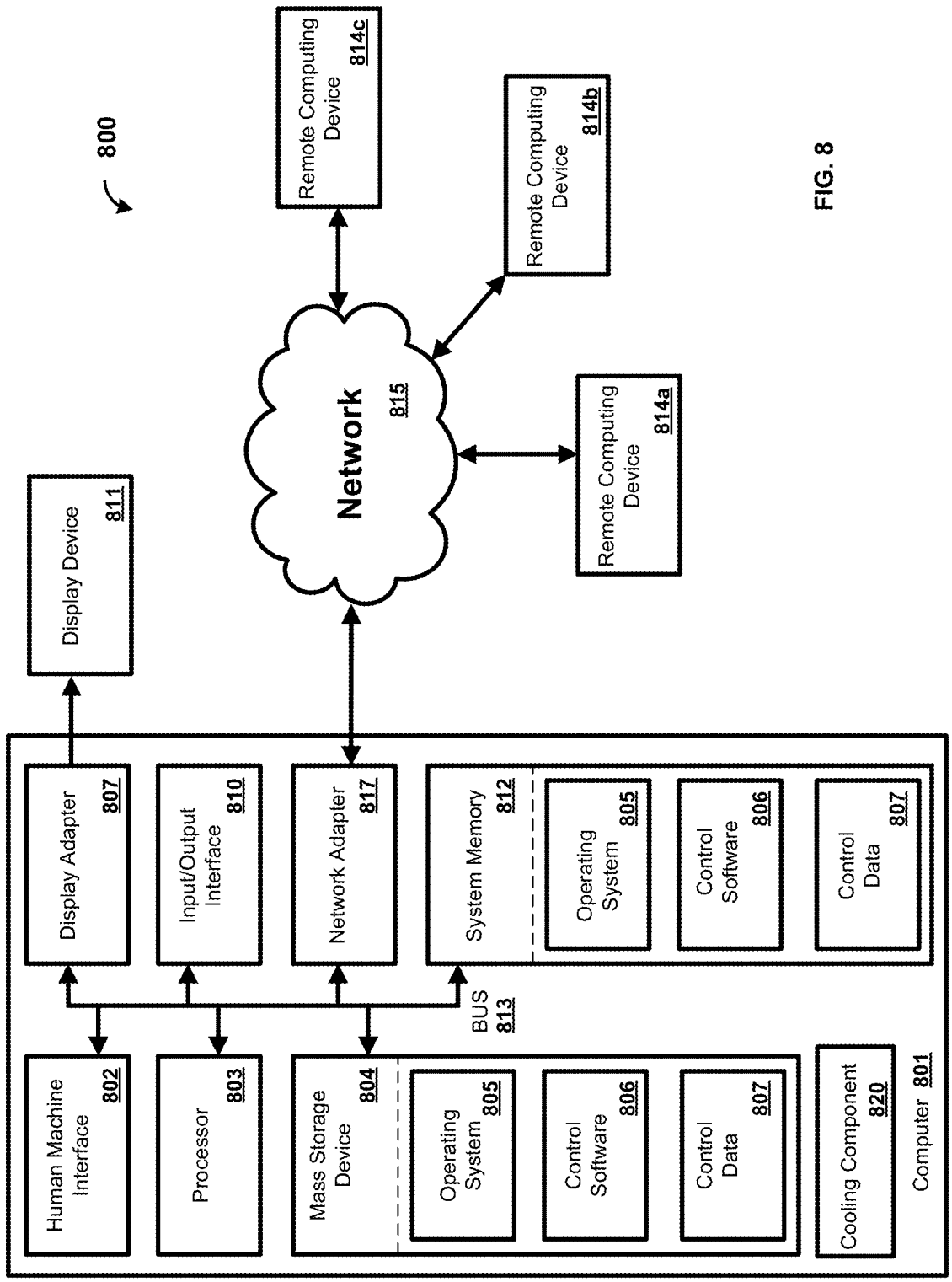
FIG. 8 shows a block diagram of an example computing device.

FIG. 8 shows a system 800 for hardware control in accordance with the present description. Each of the devices shown in FIGS. 1-4B may each be a computer 801 as shown in FIG. 8. The computer 801 may comprise one or more processors 803, a system memory 812, and a bus 813 that couples various system components including the one or more processors 803 to the system memory 812. In the case of multiple processors 803, the computer 801 may utilize parallel computing. The bus 813 is one or more of several possible types of bus structures, including a memory bus or memory controller, a peripheral bus, an accelerated graphics port, or local bus using any of a variety of bus architectures.

The computer 801 may operate on and/or comprise a variety of computer readable media (e.g., non-transitory media). The readable media may be any available media that is accessible by the computer 801 and may include both volatile and non-volatile media, removable and non-removable media. The system memory 812 has computer readable media in the form of volatile memory, such as random access memory (RAM), and/or non-volatile memory, such as read only memory (ROM). The system memory 812 may store data such as control data 807 and/or program modules such as the operating system 805 and control software 806 that are accessible to and/or are operated on by the one or more processors 803. The control data 807 may include, for example, one or more performance characteristics (e.g., hardware parameters) and/or usage parameters as described herein. The control software 806 may be used by the computer 801 to cause a cooling component 820 of the computer 801 to perform a maintenance procedure as described herein.

The computer 801 may also have other removable/non-removable, volatile/non-volatile computer storage media. FIG. 8 shows the mass storage device 804 which may provide non-volatile storage of computer code, computer readable instructions, data structures, program modules, and other data for the computer 801. The mass storage device 804 may be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

Any number of program modules may be stored on the mass storage device 804, such as the operating system 805 and the control software 806. Each of the operating system 805 and the control software 806 (e.g., or some combination thereof) may have elements of the program modules and the control software 806. The control data 807 may also be stored on the mass storage device 804. The control data 807 may be stored in any of one or more databases known in the art. Such databases may be DB2®, Microsoft® Access, Microsoft® SQL Server, Oracle®, mySQL, PostgreSQL, and the like. The databases may be centralized or distributed across locations within the network 815.

A user may enter commands and information into the computer 801 via an input device (not shown). Examples of such input devices comprise, but are not limited to, a keyboard, pointing device (e.g., a computer mouse, remote control), a microphone, a joystick, a scanner, tactile input devices such as gloves, and other body coverings, motion sensor, and the like These and other input devices may be connected to the one or more processors 803 via a human machine interface 802 that is coupled to the bus 813, but may be connected by other interface and bus structures, such as a parallel port, game port, an IEEE 1394 Port (also known as a Firewire port), a serial port, network adapter 817, and/or a universal serial bus (USB).

The display device 811 may also be connected to the bus 813 via an interface, such as the display adapter 807. It is contemplated that the computer 801 may have more than one display adapter 807 and the computer 801 may have more than one display device 811. The display device 811 may be a monitor, an LCD (Liquid Crystal Display), light emitting diode (LED) display, television, smart lens, smart glass, and/or a projector. In addition to the display device 811, other output peripheral devices may be components such as speakers (not shown) and a printer (not shown) which may be connected to the computer 801 via the Input/Output Interface 810. Any step and/or result of the methods may be output (or caused to be output) in any form to an output device. Such output may be any form of visual representation, including, but not limited to, textual, graphical, animation, audio, tactile, and the like. The display device 811 and computer 801 may be part of one device, or separate devices.

The computer 801 may operate in a networked environment using logical connections to one or more remote computing devices 814a,b,c. A remote computing device may be a personal computer, computing station (e.g., workstation), portable computer (e.g., laptop, mobile phone, tablet device), smart device (e.g., smartphone, smart watch, activity tracker, smart apparel, smart accessory), security and/or monitoring device, a server, a router, a network computer, a peer device, edge device, and so on. Logical connections between the computer 801 and a remote computing device 814a,b,c may be made via a network 815, such as a local area network (LAN) and/or a general wide area network (WAN). Such network connections may be through the network adapter 817. The network adapter 817 may be implemented in both wired and wireless environments. Such networking environments are conventional and commonplace in dwellings, offices, enterprise-wide computer networks, intranets, and the Internet.

Application programs and other executable program components such as the operating system 805 are shown herein as discrete blocks, although it is recognized that such programs and components reside at various times in different storage components of the computing device 801, and are executed by the one or more processors 803 of the computer. An implementation of the control software 806 may be stored on or sent across some form of computer readable media. Any of the described methods may be performed by processor-executable instructions embodied on computer readable media.

While specific configurations have been described, it is not intended that the scope be limited to the particular configurations set forth, as the configurations herein are intended in all respects to be possible configurations rather than restrictive. Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of configurations described in the specification.

It will be apparent to those skilled in the art that various modifications and variations may be made without departing from the scope or spirit. Other configurations will be apparent to those skilled in the art from consideration of the specification and practice described herein. It is intended that the specification and described configurations be considered as exemplary only, with a true scope and spirit being indicated by the following claims.

The invention claimed is:

1. A method comprising:
   determining, by an electronic device, based on at least one performance characteristic, that a maintenance procedure is needed for the electronic device, wherein the electronic device comprises at least one fan associated with the at least one performance characteristic and at least one communication module;
   determining, based on the maintenance procedure being needed, at least one interval of time associated with at least one of: low-priority network traffic processed by the at least one communication module or a low utilization rate of the at least one communication module;

determining, based on the at least one interval of time, a time and a duration for performance of the maintenance procedure; and causing the at least one fan to perform the maintenance procedure at the determined time for the determined duration.

2. The method of claim 1, wherein the at least one fan is proximate to a heatsink of the electronic device.

3. The method of claim 1, wherein the maintenance procedure comprises causing the at least one fan to rotate in an opposite direction.

4. The method of claim 3, wherein the at least one performance characteristic comprises a present rotational speed of the at least one fan, wherein the maintenance procedure is determined to be needed for the electronic device when the present rotational speed is less than a threshold rotational speed associated with a present level of voltage provided to the at least one fan.

5. The method of claim 1, wherein the at least one performance characteristic comprises a present temperature within the electronic device, wherein the maintenance procedure is determined to be needed for the electronic device when the present temperature is above a temperature threshold.

6. The method of claim 5, wherein the at least one performance characteristic comprises a difference between the present temperature and a previous temperature within the electronic device, wherein the maintenance procedure is determined to be needed for the electronic device when an absolute value of the difference is greater than the temperature threshold.

7. The method of claim 6, wherein the temperature threshold comprises a maximum operating temperature associated with the electronic device.

8. The method of claim 1, wherein the electronic device comprises a plurality of communication modules.

9. The method of claim 8, wherein determining the time and the duration for performance of the maintenance procedure comprises:

determining, for each of the plurality of communication modules, one or more network traffic types processed during each of a plurality of intervals of time, wherein the one or more network traffic types comprise one or more of high-priority network traffic or the low-priority network traffic; and determining, based on each utilization rate and the one or more network traffic types, the at least one interval of time associated with the low-priority network traffic and the low utilization rate for the at least one communication modules.

10. The method of claim 9, wherein causing the at least one fan of the electronic device to perform the maintenance procedure at the determined time for the determined duration comprises:

receiving an instruction comprising a first time and a first duration for the maintenance procedure; and causing, based on the instruction, the at least one fan of the electronic device to perform the maintenance procedure at the first time for the first duration.

11. The method of claim 1, wherein the electronic device is one of a plurality of electronic devices in communication with a control device.

12. A method comprising:

determining, by a control device, based on at least one performance characteristic, that a maintenance procedure is needed for an electronic device, wherein the electronic device comprises at least one fan associated with the at least one performance characteristic and at least one communication module;

determining, based on the maintenance procedure being needed, at least one interval of time associated with at least one of: low-priority network traffic processed by the at least one communication module or a low utilization rate of the at least one communication module;

determining, based on the at least one interval of time, a time and a duration for performance of the maintenance procedure; and sending, to the electronic device, an instruction comprising the determined time and the determined duration for the maintenance procedure, wherein the instruction causes the electronic device to perform the maintenance procedure at the determined time for the determined duration.

13. The method of claim 12, wherein the at least one fan is proximate to a heatsink of the electronic device.

14. The method of claim 13, wherein the maintenance procedure comprises causing the at least one fan to rotate in an opposite direction.

15. The method of claim 13, wherein the at least one performance characteristic comprises a present rotational speed of the at least one fan, wherein the maintenance procedure is determined to be needed for the electronic device when the present rotational speed is less than a threshold rotational speed associated with a present level of voltage provided to the at least one fan.

16. The method of claim 12, wherein the at least one performance characteristic comprises a present temperature within the electronic device, wherein the maintenance procedure is determined to be needed for the electronic device when the present temperature is above a temperature threshold.

17. The method of claim 16, wherein the at least one performance characteristic comprises a difference between the present temperature and a previous temperature within the electronic device, wherein the maintenance procedure is determined to be needed for the electronic device when an absolute value of the difference is greater than the temperature threshold.

18. The method of claim 16, wherein the temperature threshold comprises a maximum operating temperature associated with the electronic device.

19. The method of claim 12, wherein the electronic device comprises a plurality of communication modules.

20. The method of claim 19, wherein determining the time and the duration for performance of the maintenance procedure comprises:

determining, for each of the plurality of communication modules of the electronic device, one or more network traffic types processed during each of a plurality of intervals of time, wherein the one or more network traffic types comprise one or more of high-priority network traffic or the low-priority network traffic; and determining, by the control device based on each utilization rate and the one or more network traffic types, the at least one interval of time associated with at least one of: the low-priority network traffic or the low utilization rate for the at least one communication module.

21. The method of claim 12, wherein the electronic device is one of a plurality of electronic devices in communication with the control device.

22. A method comprising:

determining, by a control device, based on at least one first performance characteristic, that a first maintenance procedure is needed for a first electronic device of a plurality of electronic devices;

determining, based on at least one second performance characteristic, that a second maintenance procedure is needed for a second electronic device of the plurality of electronic devices;

sending, to the first electronic device, a first instruction comprising a first time and a first duration for performance of the first maintenance procedure, wherein the first instruction causes at least one fan of the first electronic device to perform the first maintenance procedure at the first time for the first duration; and sending, to the second electronic device, a second instruction comprising a second time and a second duration for performance of the second maintenance procedure, wherein the second instruction causes at least one fan of the second electronic device to perform the second maintenance procedure at the second time for the second duration.

23. The method of claim 22, wherein the at least one fan of the first electronic device and the at least one fan of the second electronic device are proximate to respective heatsinks.

24. The method of claim 22, wherein the first maintenance procedure comprises causing the at least one fan of the first electronic device to rotate in an opposite direction, and wherein the second maintenance procedure comprises causing the at least one fan of the second electronic device to rotate in an opposite direction.

25. The method of claim 23, wherein each of the at least one first performance characteristic and the at least one second performance characteristic comprise a present rotational speed, a present temperature, or a difference between the present temperature and a previous temperature.

26. The method of claim 25, wherein each of the first maintenance procedure and the second maintenance procedure is determined to be needed when the present rotational speed is less than a threshold rotational speed associated with a present level of voltage.

27. The method of claim 25, wherein each of the first maintenance procedure and the second maintenance procedure is determined to be needed when the present temperature is above a temperature threshold.

28. The method of claim 25, wherein each of the first maintenance procedure and the second maintenance procedure is determined to be needed when an absolute value of the difference between the present temperature and the previous temperature is greater than a temperature threshold.

* * * * *